(12) United States Patent
Han et al.

(10) Patent No.: US 12,336,399 B2
(45) Date of Patent: Jun. 17, 2025

(54) ARRAY SUBSTRATE AND DISPLAY DEVICE

(71) Applicant: BOE TECHNOLOGY GROUP CO., LTD., Beijing (CN)

(72) Inventors: Long Han, Beijing (CN); Libin Liu, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 763 days.

(21) Appl. No.: 17/630,211

(22) PCT Filed: Feb. 4, 2021

(86) PCT No.: PCT/CN2021/075301
§ 371 (c)(1),
(2) Date: Jan. 26, 2022

(87) PCT Pub. No.: WO2022/165717
PCT Pub. Date: Aug. 11, 2022

(65) Prior Publication Data
US 2023/0180550 A1    Jun. 8, 2023

(51) Int. Cl.
*H10K 59/131* (2023.01)
*H10K 77/00* (2023.01)
*H10K 59/80* (2023.01)

(52) U.S. Cl.
CPC .......... *H10K 59/131* (2023.02); *H10K 77/00* (2023.02); *H10K 59/8051* (2023.02)

(58) Field of Classification Search
CPC . H10K 59/131; H10K 59/1213; H10K 59/353
See application file for complete search history.

(56) References Cited

U.S. PATENT DOCUMENTS

| 10,056,034 B2 | 8/2018 | Zhu et al. |
| 11,010,583 B2 | 5/2021 | Chen et al. |

(Continued)

FOREIGN PATENT DOCUMENTS

| CN | 108878488 A | 11/2018 |
| CN | 109659322 A | 4/2019 |

(Continued)

OTHER PUBLICATIONS

Written Opinion for International Application No. PCT/CN2021/075301 mailed Oct. 27, 2021.

*Primary Examiner* — Wasiul Haider
(74) *Attorney, Agent, or Firm* — Perilla Knox & Hildebrandt LLP; Kenneth A. Knox

(57) ABSTRACT

The present disclosure provides an array substrate and a display device. The array substrate includes a plurality of initialization signal lines and a plurality of connection lines. The initialization signal lines are arranged in a first conductive layer, extend along a first direction and are arranged at intervals along a second direction; the connection lines are arranged in a second conductive layer, extend along the second direction and are arranged at intervals along the first direction; the first conductive layer and the second conductive layer are an identical layer or different layers; projections of at least one of the initialization signal lines and at least one of the connection lines on the base substrate are intersected and electrically connected, such that the projections of the initialization signal lines and the connection lines on the base substrate form a grid structure.

20 Claims, 14 Drawing Sheets

(56) References Cited

U.S. PATENT DOCUMENTS

| | | |
|---|---|---|
| 2017/0278457 A1 | 9/2017 | Zhu et al. |
| 2019/0392190 A1 | 12/2019 | Chen et al. |
| 2020/0403059 A1 | 12/2020 | Oh et al. |

FOREIGN PATENT DOCUMENTS

| | | | |
|---|---|---|---|
| CN | 109686314 A | | 4/2019 |
| CN | 110690226 A | | 1/2020 |
| CN | 111508977 A | | 8/2020 |
| CN | 111584599 A | | 8/2020 |
| CN | 111584610 A | | 8/2020 |
| CN | 111682054 | * | 9/2020 |
| CN | 111682054 A | | 9/2020 |
| CN | 112117284 A | | 12/2020 |

* cited by examiner

ARRAY SUBSTRATE AND DISPLAY DEVICE

CROSS-REFERENCE TO RELATED APPLICATION

The present application is a national phase application under 35 U.S.C. 371 of International Application No. PCT/CN2021/075301 filed Feb. 4, 2021, the contents of which being incorporated by reference in their entirety herein.

TECHNICAL FIELD

The present disclosure relates to the field of display technology and, in particular, to an array substrate and a display device.

BACKGROUND

OLED (Organic Light Emitting Diode) display technology is recognized as the third-generation display technology by the industry due to its advantages of light weight and thinness, self-luminescence, wide viewing angle, fast response speed, low brightness, and low power consumption. It has been widely used in the field of high performance display.

As the requirements for the PPI (pixel density) of the display panel are getting higher and higher, the wiring pressure on the panel is also increasing. It not only needs to be considered that various lines can be closely arranged, but considerations also need to minimize the interaction between various lines. Therefore, higher requirements are placed on the wiring design.

It should be noted that the information disclosed in the above BACKGROUND is only used to enhance the understanding of the background of the present disclosure, and therefore may include information that does not constitute the prior art known to those of ordinary skill in the art.

SUMMARY

The purpose of the present disclosure is to provide an array substrate and a display device.

According to an aspect of the present disclosure, there is provided an array substrate, including a plurality of pixel units arranged in an array, the pixel units including a plurality of sub-pixels, wherein the array substrate includes:
  a plurality of initialization signal lines arranged in a first conductive layer on the base substrate, extending along a first direction and arranged at intervals along a second direction, and configured to provide initialization signals to each of the sub-pixels; the first direction and the second direction intersect;
  a plurality of connection lines arranged in a second conductive layer on the base substrate, extending along the second direction and arranged at intervals along the first direction;
  wherein, the first conductive layer and the second conductive layer are an identical layer or different layers;
  wherein, projections of at least one of the initialization signal lines and at least one of the connection lines on the base substrate are intersected and electrically connected, such that the projections of the initialization signal lines and the connection lines on the base substrate form a grid structure.

In an exemplary embodiment of the present disclosure, the array substrate includes a base substrate and a first source-drain layer, a second source-drain layer and an anode layer sequentially stacked on the base substrate; in the first conductive layer and the second conductive layer, at least any one thereof is the first source-drain layer, and the other one thereof is the first source-drain layer or the anode layer; the first direction is a row direction, and the second direction is a column direction;
  the array substrate further includes:
  data lines arranged on the second source-drain layer, extending along the column direction and arranged at intervals along the row direction, and configured to provide data signals to each of the sub-pixels;
  power supply lines arranged on the second source-drain layer, extending along the column direction and arranged at intervals along the row direction, and configured to provide power supply signals to each of the sub-pixels.

In an exemplary embodiment of the present disclosure, the first conductive layer and the second conductive layer are both the first source-drain layers, the initialization signal lines extend along the row direction, and the connection lines extend along the column direction, each of the initialization signal lines is connected to each of the connection lines and intersected in a grid shape.

In an exemplary embodiment of the present disclosure, the first conductive layer is the first source-drain layer, the second conductive layer is the anode layer; the initialization signal lines are arranged in the first source-drain layer, extend along the row direction and are arranged at intervals along the column direction; the connection lines are arranged in the anode layer, extend along the column direction and are arranged at intervals along the row direction; each of the initialization signal lines and each of the connection lines are electrically connected through a via hole, and the projections of the plurality of initialization signal lines and the plurality of connection lines on the base substrate intersect in a grid shape.

In an exemplary embodiment of the present disclosure, the first conductive layer is an anode layer, the second conductive layer is a first source-drain layer; the initialization signal lines are arranged in the anode layer, extend along the row direction and are arranged at intervals along the column direction; the connection lines are arranged in the first source-drain layer, extend along the column direction and are arranged at intervals along the row direction; each of the initialization signal lines and each of the connection lines are electrically connected through a via hole, and the projections of the plurality of initialization signal lines and the plurality of connection lines on the base substrate intersect in a grid shape.

In an exemplary embodiment of the present disclosure, the second source-drain layer is further provided with a plurality of seventh conductive connection parts, and the seventh conductive connection parts are distributed in a sub-pixel region where the projections of the initialization signal line and the connection line intersect;
  wherein, the seventh conductive connection part is connected to the initialization signal line through a via hole, and the seventh conductive connection part is connected to the connection line through another via hole, such that the initialization signal line and the connection line are electrically connected through the seventh conductive connection part.

In an exemplary embodiment of the present disclosure, the array substrate further includes a first gate line layer and a second gate line layer disposed on the base substrate;
  the sub-pixel further includes a sub-pixel driving circuit, the sub-pixel driving circuit includes a capacitor and a driving transistor, the capacitor includes a first plate and a second plate, the first plate is arranged in the first gate line layer, the second plate is arranged in the second gate line layer; the first plate of the capacitor is multiplexed as a gate of the driving transistor, a first electrode of the driving transistor is connected to the power supply line;

the first source-drain layer is further provided with a plurality of third conductive connection parts, and the third conductive connection parts are distributed in each sub-pixel region;

wherein, the third conductive connection part is connected to the first electrode of the driving transistor through a via hole, and the third conductive connection part is further connected to the power supply line through a via hole, such that the power supply line is electrically connected to the first electrode of the driving transistor through the third conductive connection part.

In an exemplary embodiment of the present disclosure, the array substrate further includes a plurality of scan lines, the scan lines are provided in the first gate line layer, extend along the row direction and are arranged at intervals along the column direction, and are configured to provide scanning signals to each of the sub-pixels;

the sub-pixel driving circuit further includes a first transistor, a gate of the first transistor is connected to the scan line, a first electrode of the first transistor is connected to the data line, and a second electrode of the first transistor is connected to the second plate of the capacitor;

the first source-drain layer is further provided with a plurality of fourth conductive connection parts, and the fourth conductive connection parts are distributed in each sub-pixel region;

wherein, the fourth conductive connection part is connected to the first electrode of the first transistor through a via hole, and the fourth conductive connection part is further connected to the data line through a via hole, such that the data line is electrically connected to the first electrode of the first transistor through the fourth conductive connection part.

In an exemplary embodiment of the present disclosure, the sub-pixel includes an anode disposed in the anode layer; the array substrate further includes a plurality of reset signal lines, the reset signal lines are disposed in the first gate line layer, extend along the row direction and are arranged at intervals along the column direction, and are configured to provide reset signals to each of the sub-pixels;

the sub-pixel driving circuit further includes an eighth transistor, a gate of the eighth transistor is connected to the reset signal line, a first electrode of the eighth transistor is electrically connected to the initialization signal line, and a second electrode of the eighth transistor is electrically connected to the anode of the sub-pixel;

the first source-drain layer is further provided with a plurality of fifth conductive connection parts, the second source-drain layer is further provided with a plurality of sixth conductive connection parts, and the fifth conductive connection parts and the sixth conductive connection parts are distributed in each sub-pixel region;

wherein, the fifth conductive connection part and the second electrode of the eighth transistor are connected through a via hole, the fifth conductive connection part and the sixth conductive connection part are connected through a via hole, and the sixth conductive connection part and the anode are connected through a via hole, such that the second electrode of the eighth transistor is electrically connected to the anode of the sub-pixel.

In an exemplary embodiment of the present disclosure, the array substrate further includes a plurality of light-emitting control signal lines, the light-emitting control signal lines are disposed in the first gate line layer, extend along the row direction and are arranged at intervals along the column direction, and are configured to provide light-emitting control signals to each of the sub-pixels;

the sub-pixel driving circuit further includes a second transistor and a ninth transistor, a gate of the second transistor is connected to the scan line, and a first electrode of the second transistor is connected to a second electrode of the driving transistor, a second electrode of the second transistor is connected to the first plate of the capacitor; a gate of the ninth transistor is connected to the light-emitting control signal line, and a first electrode of the ninth transistor is electrically connected to the first plate of the capacitor;

the first source-drain layer is further provided with a plurality of first conductive connection parts, and the first conductive connection parts are distributed in each sub-pixel region;

wherein, the first conductive connection part is connected to the second electrode of the second transistor and the first electrode of the ninth transistor through a via hole, and the first conductive connection part is further connected to the first plate of the capacitor through a via hole, such that the second electrode of the second transistor and the first electrode of the ninth transistor are electrically connected to the first plate of the capacitor.

In an exemplary embodiment of the present disclosure, the sub-pixel driving circuit further includes a fifth transistor and a sixth transistor, a gate of the fifth transistor is connected to the reset signal line, and a first electrode of the fifth transistor is electrically connected to the initialization signal line, a second electrode of the fifth transistor is electrically connected to the second plate of the capacitor; a gate of the sixth transistor is connected to the light-emitting control signal line, a first electrode of the sixth transistor is electrically connected to the initialization signal line, and a second electrode of the sixth transistor is electrically connected to the second plate of the capacitor;

the first source-drain layer is further provided with a plurality of second conductive connection parts, and the second conductive connection parts are distributed in each sub-pixel region;

wherein, the second conductive connection part is connected to the second electrode of the first transistor, the second electrode of the fifth transistor, and the second electrode of the sixth transistor through a via hole, and the second conductive connection part is further connected to the second plate of the capacitor through a via hole, such that the second electrode of the first transistor, the second electrode of the fifth transistor, the second electrode of the sixth transistor are electrically connected to the second plate of the capacitor.

In an exemplary embodiment of the present disclosure, the sub-pixel driving circuit further includes:

a fourth transistor, wherein a gate of the fourth transistor is connected to the reset signal line, a first electrode of the fourth transistor is electrically connected to the initialization signal line, and a second electrode of the fourth transistor is electrically connected to the first plate of the capacitor;

a seventh transistor, wherein a gate of the seventh transistor is connected to the light-emitting control signal line, a first electrode of the seventh transistor is electrically connected to the second electrode of the driving transistor, a second electrode of the seventh transistor is electrically connected to the anode of the sub-pixel.

In an exemplary embodiment of the present disclosure, the array substrate further includes:

a plurality of power supply leads arranged in the second gate line layer, extending along the row direction and arranged at intervals along the column direction, wherein the power supply lines located in each sub-pixel region in an identical row are connected to one power supply lead through a via hole;

wherein, the third conductive connection part is further connected to the power supply line through a via hole, such that the power supply line and the power supply lead are electrically connected.

In an exemplary embodiment of the present disclosure, a quantity of the connection lines is equal to a quantity of sub-pixels in the row direction, and in the row direction, the initialization signal lines and the connection lines are electrically connected through via holes in each sub-pixel region; or a quantity of the connection lines is smaller than a quantity of sub-pixels in the row direction, and in the row direction, the initialization signal lines and the connection lines are electrically connected through via holes in a part of the sub-pixel regions.

According to an aspect of the present disclosure, there is provided a display device, including the array substrate described above.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the disclosure, and explain the principle of the disclosure together with the specification. The drawings in the following description are only some embodiments of the present disclosure. For those of ordinary skill in the art, other drawings can be obtained based on these drawings without creative work.

DETAILED DESCRIPTION

Figure 1:
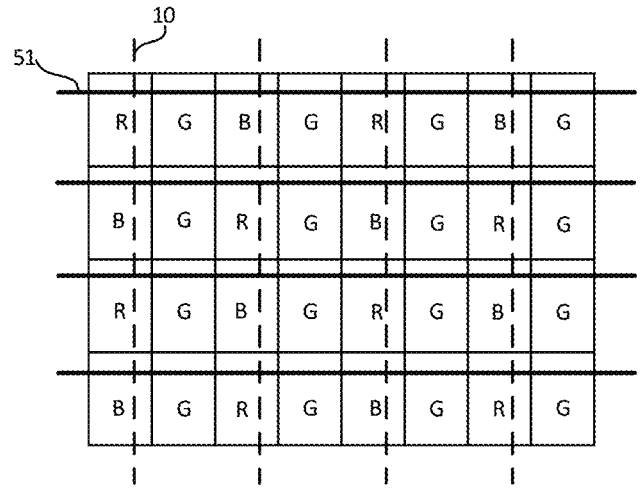
FIG. 1 is a schematic diagram of the positional relationship between an initialization signal line and a connection line in an embodiment.

Example embodiments will now be described more fully with reference to the accompanying drawings. Example embodiments, however, can be embodied in various forms and should not be construed as limited to the embodiments set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "upper" and "lower" are used in this specification to describe the relative relationship of one component of an icon to another component, these terms are used in this specification only for convenience, such as according to the direction of the example described. It will be appreciated that if the device of the icon is turned upside down, the component described as "upper" will become the "lower" component. When a certain structure is "on" other structures, it may mean that the certain structure is integrally formed on other structures, or that the certain structure is "directly" arranged on other structures, or that the certain structure is "indirectly" arranged on another structure through another structure.

The terms "a", "an", "the", "said", and "at least one" are used to indicate the presence of one or more elements/components/etc.; the terms "including" and "having" are used to indicate an open-ended inclusive meaning and means that additional elements/components/etc. may be present in addition to the listed elements/components/etc.; the terms "first", "second", and "third" etc. are only used as a marker or label, not a limit on the number of its objects.

The reference numerals used in the figures are as follows: 100, active layer; 200, first gate insulating layer; 300, first gate line layer; 400, second gate insulating layer; 500, second gate line layer; 500', second gate line layer; 600, first dielectric layer; 700, first source-drain layer; 800, second dielectric layer; 900, second source-drain layer; 1000, passivation layer; 1100, anode layer; 31, scan line; 32, reset signal line; 33, light-emitting control signal line; 51, initialization signal line; 510, signal segment; 511, main body segment; 512, extension segment; 52, power supply lead; 71, data line; 72, power supply line; 73, third conductive connection part; 74, second conductive connection part; 75, first conductive connection part; 76, fourth conductive connection part; 77, fifth conductive connection part; 78, sixth conductive connection part; 79, seventh conductive connection part; 80, via hole; 91, anode; and 10, connection line.

An embodiment of the present disclosure provides an array substrate. Referring to FIG. 1, the array substrate is arranged with a plurality of pixel units along a row direction and a column direction, and the pixel unit includes a plurality of sub-pixels. The array substrate includes a plurality of initialization signal lines 51 and a plurality of connection lines 10. A plurality of initialization signal lines 51 are provided in the first conductive layer, extend along the row direction, and are arranged at intervals along the column direction, and each initialization signal line 51 is used to provide initialization signals to each sub-pixel in its extending direction. A plurality of connection lines 10 are disposed in the second conductive layer, extend along the column direction, and are arranged at intervals along the row direction. In the figure, as an example, the horizontal direction is the row direction, and the vertical direction is the column direction. The projections of at least one of the initialization signal lines 51 and at least one of the connection lines 10 on the base substrate are intersected and electrically connected, such that the projections of the initialization signal lines 51 and the connection lines 10 on the base substrate form a grid structure.

The criss-crossed initialization signal lines 51 and the connection lines 10 are connected into a grid structure, which increases the paths of the initialization signal, and the initialization signal can be transmitted to each sub-pixel through more paths, thereby reducing the problem of IR drop being too large caused by the single current transmission path.

In the embodiment of the present disclosure, the number of connection lines 10 may be equal to the number of sub-pixels in the row direction, or may be also smaller than the number of sub-pixels in the row direction.

Specifically, when the number of connection lines 10 is smaller than the number of sub-pixels in the row direction, it means that, in the row direction, the initialization signal lines 51 and the connection lines 10 are electrically connected in part of the sub-pixel regions. Referring to FIG. 1, the number of connection lines 10 is half of the number of sub-pixels in the row direction, and one connection line 10 is provided every other sub-pixel, then the initialization signal line 51 is electrically connected to one connection line 10 every other sub-pixel. Therefore, one of every two adjacent sub-pixels in the row direction is provided with the connection line 10, and the other is not provided with the connection line 10. In other embodiments, when the number of connection lines 10 is smaller than the number of sub-pixels in the row direction, different numbers of sub-pixels may also be spaced between two adjacent connection lines 10.

When the number of connection lines 10 is equal to the number of sub-pixels in the row direction, it means that, in the row direction, the initialization signal lines 51 and the connection lines 10 are electrically connected in each sub-pixel region. Therefore, the connection line 10 is provided in each sub-pixel in the row direction. As long as the projections of the plurality of connection lines 10 and the plurality of initialization signal lines 51 on the base substrate can form a grid structure.

It can be understood that as the number of connection lines 10 is more, the grid is denser, the transmission paths of the initialization signal is more, and the IR drop can be reduced more, but the space pressure of the wiring will also be greater, and the manufacturing process will be more difficult. Therefore, the specific number can be set according to the actual situation.

It should be noted that, taking that the initialization signal line 51 that extends in the row direction and the connection line that extends in the column direction as an example, the horizontal arrangement of the initialization signal line 51 means that the main structure of the initialization signal line 51 extends in the horizontal direction. In actual products, there may be some parts not completely horizontally arranged, such as it may be bent to avoid other circuit structures, or it may extend in other directions to facilitate the connection with other lines, etc., as long as the overall direction of the initialization signal line 51 is horizontal. Similarly, the longitudinal arrangement of the connection line 10 means that the main structure of the connection line 10 extends in the longitudinal direction, and the overall direction is the longitudinal direction.

The array substrate of this embodiment is described in detail below.

In this embodiment, each pixel unit is composed of four RGBG sub-pixels, and each sub-pixel is driven by a separate sub-pixel driving circuit.

Figure 2:
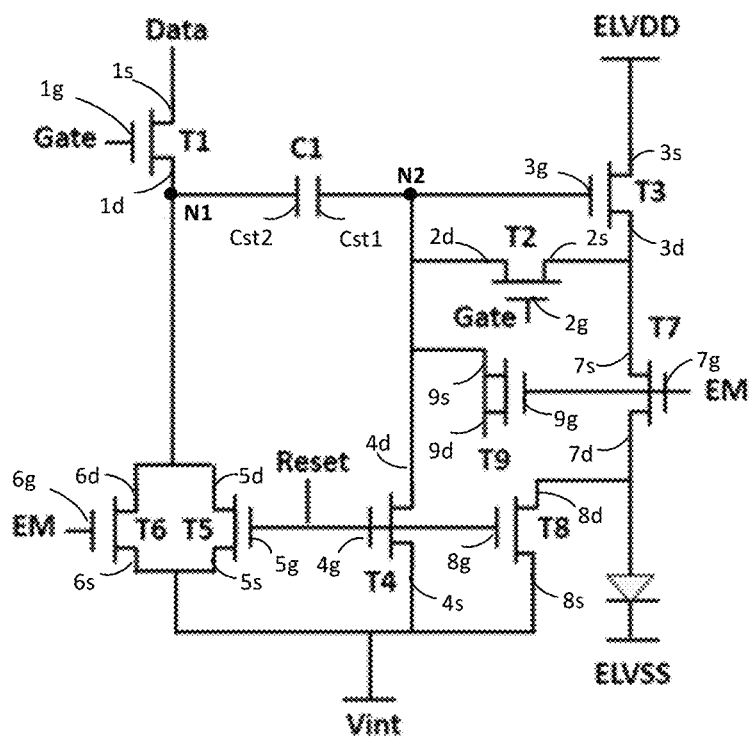
FIG. 2 is a schematic structural diagram of a sub-pixel circuit of a 9T1C.

FIG. 2 shows a 9T1C sub-pixel circuit structure. The sub-pixel circuit structure includes a capacitor and nine TFT transistors T1-T9. In this embodiment, the third transistor T3 is a driving transistor, and the other transistors are switching transistors.

Referring to FIG. 2, the capacitor includes a first plate Cst1 and a second plate Cst2. The first plate Cst1 is provided in the first gate line layer 300, and the second plate Cst2 is provided in the second gate line layer 500. The first plate Cst1 is connected to the node N2, and the second plate Cst2 is connected to the node N1. The gate 3g of the driving transistor T3 (third transistor) is multiplexed by the first plate Cst1 of the capacitor, and the source 3s of the driving transistor T3 is connected to the power supply line 72. The gate 1g of the first transistor T1 is connected to the scan line 31, and the source 1s of the first transistor T1 is connected to the data line 71, and the drain 1d of the first transistor T1 is connected to the node N1. The gate 2g of the second transistor T2 is connected to the scan line 31, the source 2s of the second transistor T2 is connected to the drain 3d of the driving transistor T3, and the drain 2d of the second transistor T2 is connected to the node N2. The gate 4g of the fourth transistor T4 is connected to the reset signal line 32, the source 4s of the fourth transistor T4 is electrically connected to the initialization signal line 51, and the drain 4d of the fourth transistor T4 is connected to the node N2. The gate 5g of the fifth transistor T5 is connected to the reset signal line 32, the source 5s of the fifth transistor T5 is electrically connected to the initialization signal line 51, and the drain 5d of the fifth transistor T5 is connected to the node N1. The gate 6g of the sixth transistor T6 is connected to the light-emitting control signal line 33, the source 6s of the sixth transistor T6 is electrically connected to the initialization signal line 51, and the drain 6d of the sixth transistor T6 is connected to the node N1. The gate 7g of the seventh transistor T7 is connected to the light-emitting control signal line 33, the source 7s of the seventh transistor T7 is electrically connected to the drain 3d of the driving transistor T3, and the drain 7d of the seventh transistor T7 is electrically connected to the anode 91 of the sub-pixel. The gate 8g of the eighth transistor T8 is connected to the reset signal line 32, the source 8s of the eighth transistor T8 is electrically connected to the initialization signal line 51, and the drain 8d of the eighth transistor T8 is electrically connected to the anode 91 of the sub-pixel. The gate 9g of the ninth transistor T9 is connected to the light-emitting control signal line 33, and the source 9s of the ninth transistor T9 is connected to the node N2.

The initialization signal provided by the initialization signal line 51 is Vint, the reset signal provided by the reset signal line 32 is Reset, the light-emitting control signal provided by the light-emitting control signal line 33 is EM, the scan signal provided by the scan line 31 is gate, and the data signal provided by the data line 71 is data, and the power supply signal provided by the power supply line 72 is ELVDD.

Figure 3:
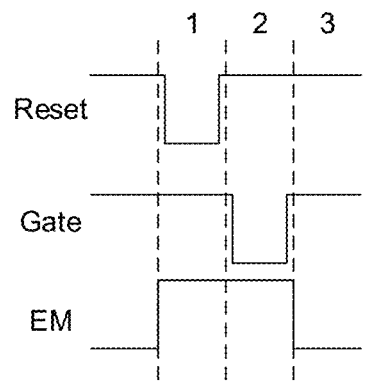
FIG. 3 is a timing diagram of the sub-pixel circuit structure shown in FIG. 2.

Referring to the timing diagram shown in FIG. 3, the specific working principle of the sub-pixel compensation circuit is as follows.

In the first stage, the reset signal Reset is at a low level. The fourth transistor T4 is turned on, and the initial signal Vint initializes the point N2. At this time, the potential of the N2 point is the initial signal Vint. The fifth transistor T5 is turned on, and the initial signal Vint is written into the N1 point. The eighth transistor T8 is turned on, to release the residual charge displayed in the previous frame, and the initial signal Vint is written to reduce the voltage difference between the anode and cathode of the OLED device, reduce the brightness of the OLED device at a low gray level, and improve the contrast of the pixel.

In the second stage, the signal Gate of the scan line 31 is at a low level. The first transistor T1 is turned on, at this time, the potential of the N1 point is Vdata, and the data signal voltage is written into the N1 point. The second transistor T2 is turned on, the diode connection of the driving transistor T3 is sampled, the potential of the N2 point rises to ELVDD+Vth, the driving transistor T3 gradually changes from the on state to the off state, and the threshold voltage Vth of the driving transistor T3 is compensated.

In the third stage, the light-emitting control signal EM is at a low level. The sixth transistor T6 is turned on, at this time, the potential of the point N1 is the initial signal Vint. The ninth transistor T9 is turned on, and the leakage of the N2 point is reduced in the light-emitting stage. As the potential of the N1 point jumps, the potential of the N2 point becomes ELVDD+Vth+Vint−Vdata at this time. The seventh transistor T7 is turned on, the driving current is output, and the OLED device emits light. The current calculation formula of the OLED device is:

$$I_{on} = \frac{1}{2}K \cdot (V_{gs} - |V_{th}|)^2 = \frac{\mu W C_{ox}}{2L} \times (V_{int} - V_{data})^2$$

Through the above circuit, the threshold voltage Vth of the driving transistor T3 can be compensated in the sampling stage, thereby eliminating the influence of the difference of the DTFT threshold voltage Vth of different pixels on the uniformity of display brightness.

In this embodiment, Vint can be used as an initialization signal, and can also be used as a reference signal during data writing.

In this embodiment, the sub-pixel driving circuits of the above-mentioned sub-pixels are fabricated on a base substrate. An active layer 100, a first gate line layer 300, a second gate line layer 500, a first source-drain layer 700, a second source-drain layer 900, and an anode layer 1100 are stacked on the base substrate. These film layers are used to form various signal lines or wires, and to provide corresponding electrical signals to each sub-pixel driving circuit. The insulating layer is used for insulation between two film layers. For example, a first gate insulating layer 200 is provided between the active layer 100 and the first gate line layer 300, and a second gate insulating layer 400 is provided between the first gate line layer 300 and the second gate line layer 500. A first dielectric layer 600 is provided between the second gate line layer 500 and the first source-drain layer 700, and a second dielectric layer 800 is provided between the first source-drain layer 700 and the second source-drain layer 900. A passivation layer 1000 is further provided above the second source-drain layer 900. The anode layer 1100, the organic light-emitting layer, the cathode layer, and other film layers of the sub-pixels are disposed above the passivation layer 1000 to form an OLED light-emitting device, and the OLED light-emitting devices of each sub-pixel are separated by a pixel defining layer. In this embodiment, only the passivation layer 1000 being provided between the second source-drain layer 900 and the anode layer 1100 is taken as an example for description. In other embodiments, other film layers such as a planarization layer may also be provided.

FIGS. 4-8 show schematic diagrams of film stacking of the active layer 100, the first gate line layer 300, the second gate line layer 500, the first source-drain layer 700, and the second source-drain layer 900 in one sub-pixel region in the first embodiment. FIGS. 9-12 show schematic diagrams of the structure of each layer of the first gate line layer 300, the second gate line layer 500, the first source-drain layer 700, and the second source-drain layer 900 in a sub-pixel region. FIG. 13 shows a schematic cross-sectional view along the A-A direction in FIG. 8.

Figure 4:
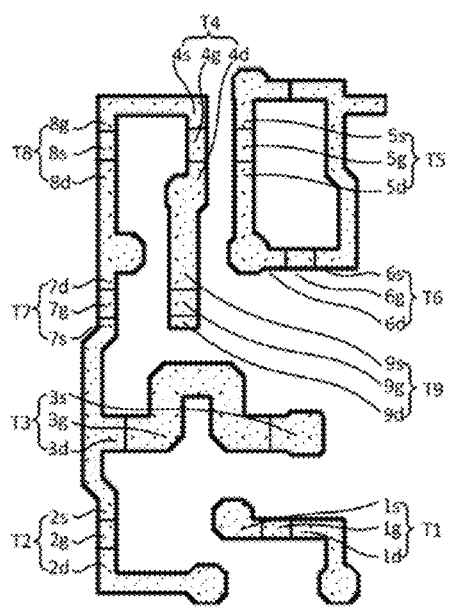
FIG. 4 is a schematic structural diagram of an active layer in the first embodiment.

Referring to FIG. 4, the active layer 100 is used for disposing the channel regions (1g-9g), the first electrode (1s-9s) and the second electrodes (1d-9d) of the respective TFT transistors.

Figure 5:
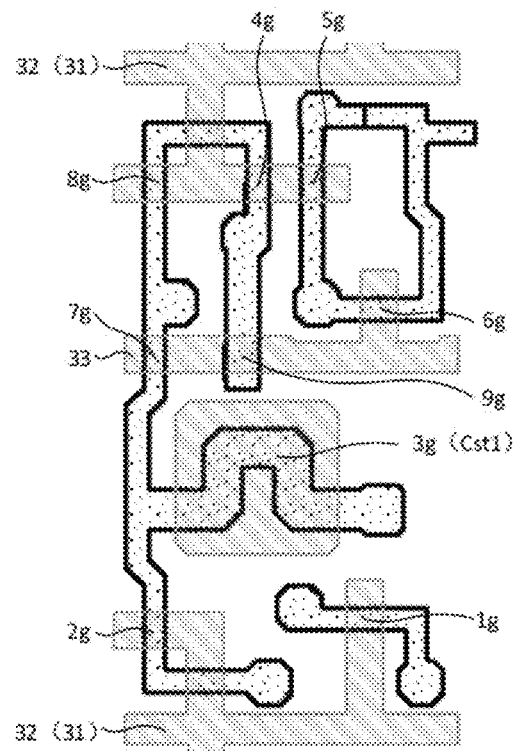
FIG. 5 is a schematic view of film stacking of the active layer and the first gate line layer in the first embodiment.
Figure 9:
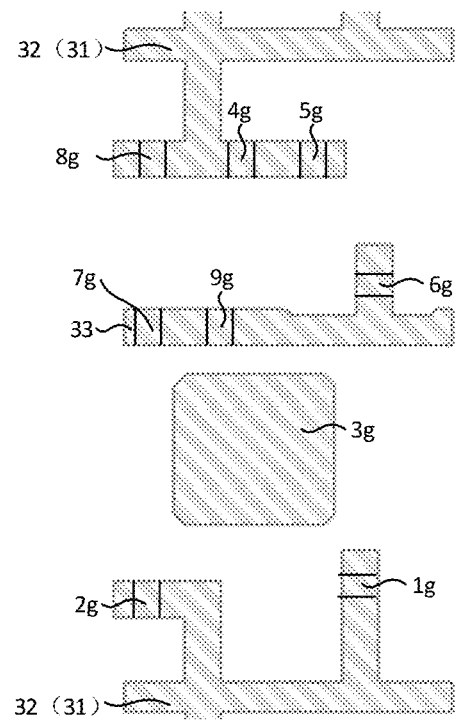
FIG. 9 is a schematic structural diagram of the first gate line layer in the first embodiment.

Referring to FIGS. 5 and 9, the first gate line layer 300 is used to set to form gates (e.g., 1g to 9g) of transistors in the sub-pixel driving circuit, the first plate Cst1 of the capacitor, and a plurality of scan lines 31, a plurality of reset signal lines 32, a plurality of light-emitting control signal lines 33 and other structures. A plurality of scan lines 31 are arranged at intervals in the column direction and extend in the row direction, and are used for providing scan signals to each sub-pixel located in the same row in the row direction. A plurality of reset signal lines 32 are arranged at intervals in the column direction and extend in the row direction, and are used for providing reset signals to each sub-pixel located in the same row in the row direction. The plurality of light-emitting control signal lines 33 extend in the row direction and are arranged at intervals in the column direction, and are used for providing light-emitting control signals to each sub-pixel located in the same row in the row direction. In each sub-pixel region, the reset signal line 32 is located at the top, the scan line 31 is located at the bottom, the light-emitting control signal line 33 is located between the reset signal line 32 and the scan line 31, and the first plate Cst1 of the capacitor is located between the light-emitting control signal line 33 and the scan line 31. In the column direction, the reset signal line 32 of the sub-pixel of the next stage can be connected to the scan line 31 of the sub-pixel of the previous stage, such that the scan signal of the sub-pixel of the previous stage can be used as the reset signal of the sub-pixel of the next stage, thus avoiding introducing a dedicated signal line separately for the reset signal, effectively reducing the wiring space.

Figure 6:
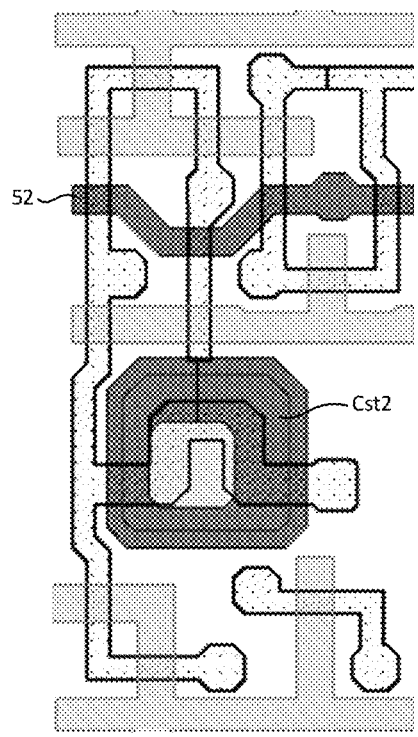
FIG. 6 is a schematic diagram of film stacking of the active layer, the first gate line layer, and the second gate line layer in the first embodiment.
Figure 10:
FIG. 10 is a schematic structural diagram of the second gate line layer in the first embodiment.
Figure 10:
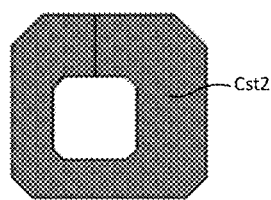

Referring to FIGS. 6 and 10, the second gate line layer 500 is used to set to form structures such as a second plate Cst2 of a capacitor, and the second plate Cst2 of the capacitor corresponds to the first plate Cst1 in the thickness direction of the array substrate. In this embodiment, the second gate line layer 500 further includes a plurality of power supply leads 52. The plurality of power supply leads 52 extend along the row direction and are arranged at intervals along the column direction. The power supply leads 52 are used to connect the power supply lines 72 in each sub-pixel region of the same row through the via hole, so that the projections of the power supply leads 52 and the power supply lines 72 also forms a grid structure, which can reduce the voltage drop of the power supply voltage.

Figure 7:
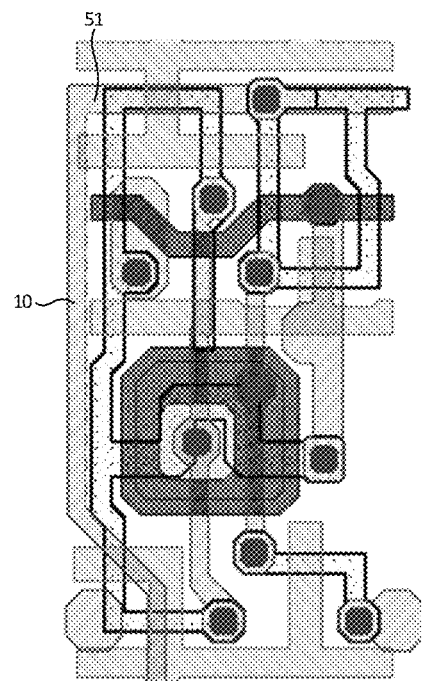
FIG. 7 is a schematic view of film stacking of the active layer, the first gate line layer, the second gate line layer, and the first source-drain layer in the first embodiment.
Figure 11:
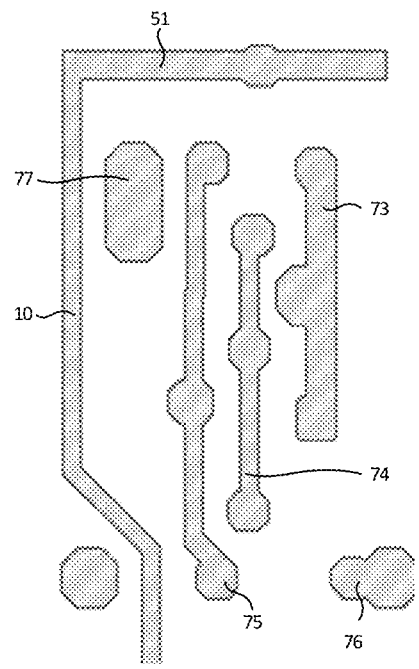
FIG. 11 is a schematic structural diagram of a first source-drain layer in the first embodiment.

Referring to FIG. 7, FIG. 11 and FIG. 13, in this embodiment, the first conductive layer and the second conductive layer are both the first source-drain layers 700, that is, the initialization signal lines 51 and the connection lines 10 are both disposed in the first source-drain layer 700, the initialization signal lines 51 extend in the row direction, the connection lines 10 extend in the column direction, and each initialization signal line 51 is connected to each connection line 10 and they intersect in a grid shape. That is to say, in this embodiment, each sub-pixel region has the initialization signal line 51 and the connection line 10. In the prior art, the initialization signal line 51 is often disposed in the gate layer, and the initialization signal is easily affected by the gate driving signal. The initialization signal line 51 and the connection line 10 of the present disclosure are in the first source-drain layer 700, which can reduce the parasitic capacitance between the initialization signal and the gate driving signal, enhance the anti-interference ability, and improve the product display uniformity. The initialization signal line 51 is also connected to the source 5s of the fifth transistor T5 and the source 6s of the sixth transistor T6, and is further connected to the source 4s of the fourth transistor T4 and the source 8s of the eighth transistor T8, through a via hole penetrating the first gate insulating layer 200, the second gate insulating layer 400 and the first dielectric layer 600. It should be noted that the connection line 10 shown in the figure is designed to be bent in order to avoid other structures, but it does not affect the overall extending direction of the connection line 10 being the longitudinal direction.

Figure 8:
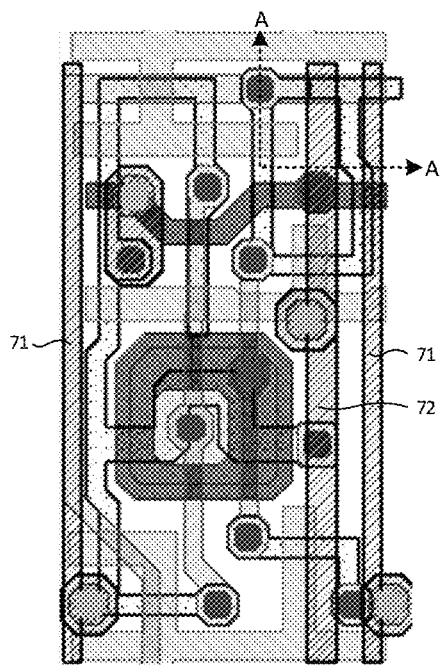
FIG. 8 is a schematic diagram of film stacking of an active layer, a first gate line layer, a second gate line layer, a first source-drain layer, and a second source-drain layer in the first embodiment.
Figure 12:
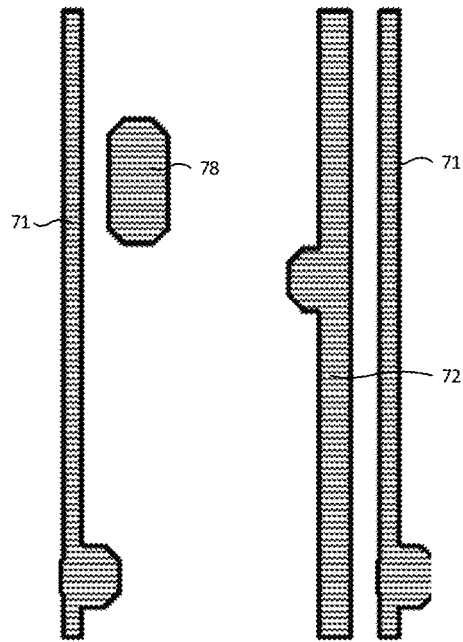
FIG. 12 is a schematic structural diagram of the second source-drain layer in the first embodiment.
Figure 13:
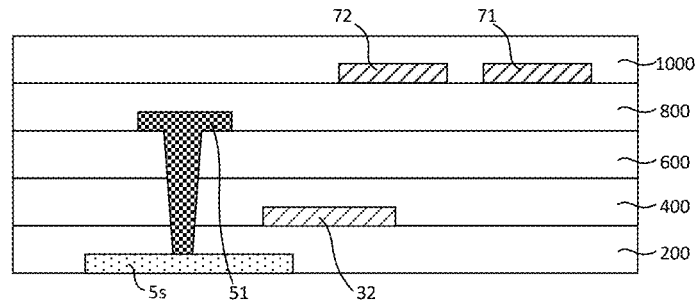
FIG. 13 is the sectional view taken along the A-A direction in FIG. 8.

Referring to FIG. 8 and FIG. 12, the power supply lines 72 and the data lines 71 are both disposed in the second source-drain layer 900. The power supply lines 72 extend in the column direction and are arranged at intervals in the row direction, and are used to provide power supply signals to each sub-pixel in the same column. The power supply line 72 is connected to the power supply lead 52 through a via hole, so as to realize the grid of the power supply line. The data lines 71 extend along the column direction and are arranged at intervals along the row direction, and are used for providing data signals to each sub-pixel located in the same column. The projections of the power supply lines 72 and the data lines 71 on the array substrate do not overlap with the first plate Cst1 and the second plate Cst2 of the capacitor. In the present disclosure, the power supply line 72 and the data line 71 are arranged in the second source-drain layer 900, and are arranged in different layers with the initialization signal line 51 and the connection line 10, which can reduce the parasitic capacitance of the power supply line 72, the data line 71 and other nodes, and enhance the stability of the power supply signal and the data signal, which is more suitable for display products driven by the high frequency.

Continuing to refer to FIGS. 7 and 11, the first source-drain layer 700 is further provided with a plurality of first conductive connection parts 75, and each first conductive connection part 75 is disposed in the source-drain layer 700 and distributed in each sub-pixel region. As shown in the figure, in each sub-pixel region, the projection of the first conductive connection part 75 on the base substrate overlaps with the projection of the 2d of the second transistor T2 and the first electrode 9s of the ninth transistor T9, and they are connected through the via hole penetrating the first gate insulating layer 200, the second gate insulating layer 400 and the first dielectric layer 600, and the projection of the first conductive connection part 75 on the base substrate also overlaps with the projection of the first plate Cst1 of the capacitor, and they are connected through the via hole penetrating the second gate insulating layer 400 and the first dielectric layer 600. That is to say, both 2d and 9s are electrically connected to the first plate Cst1 of the capacitor through the first conductive connection part 75. In each sub-pixel region, the first conductive connection part 75 is located at the right side of the connection line 10.

The first source-drain layer 700 is further provided with a plurality of second conductive connection parts 74, and each second conductive connection part 74 is disposed in the source-drain layer 700 and distributed in each sub-pixel region. As shown in the figure, in each sub-pixel region, the projection of the second conductive connection part 74 on the base substrate overlaps with the projection of the drain 1d of the first transistor T1, the drain 5d of the fifth transistor T5 and the drain 6d of the sixth transistor T6, and they are connected through the via hole penetrating the first gate insulating layer 200, the second gate insulating layer 400 and the first dielectric layer 600, and the projection of the second conductive connection part 74 on the base substrate also overlaps with the projection of the second plate Cst2 of the capacitor, and they are connected through the via hole penetrating the first dielectric layer 600. That is to say, 1d, 5d and 6d are all electrically connected to the second plate Cst2 of the capacitor through the second conductive connection part 74. In each sub-pixel region, the second conductive connection part 74 is located at the right side of the first conductive connection part 75.

The first source-drain layer 700 is further provided with a plurality of third conductive connection parts 73, and each third conductive connection part 73 is distributed in each sub-pixel region. As shown in the figure, in each sub-pixel region, the projection of the third conductive connection part 73 on the base substrate overlaps with the projection of the source 3s of the driving transistor T3, and they are connected through the via hole penetrating the first gate insulating layer 200, the second gate insulating layer 400 and the first dielectric layer 600, and the projection of the third conductive connection part 73 on the base substrate also overlaps with the projection of the power supply line 72, and they are connected through the via hole penetrating the second dielectric layer 800. That is, the third conductive connection part 73 is used to connect the source 3s of the driving transistor T3 and the power supply line 72. The projection of the third conductive connection part 73 on the base substrate also overlaps with the projection of the power supply lead 52, and they are connected through a via hole penetrating the first dielectric layer 600, to connect the power supply line 72 to the power supply lead 52. It should be noted that, in each sub-pixel region, the third conductive connection part 73 is located at the right side of the second conductive connection part 74.

The first source-drain layer 700 is further provided with a plurality of fourth conductive connection parts 76, and each fourth conductive connection part 76 is disposed in the first source-drain layer 700 and distributed in each sub-pixel region. As shown in the figure, in each sub-pixel region, the projection of the fourth conductive connection part 76 on the base substrate overlaps with the projection of the source Is of the first transistor T1, and they are connected through the via hole penetrating the first gate insulating layer 200, the second gate insulating layer 400 and the first dielectric layer 600, and the projection of the fourth conductive connection part 76 on the base substrate also overlaps with the projection of the data line 71, and they are connected through the via hole penetrating the second dielectric layer 800. That is, the fourth conductive connection part 76 is used to connect the source Is of the first transistor T1 with the data line 71. In each sub-pixel region, the fourth conductive connection part 76 is located at the right side of the third conductive connection part 73.

The first source-drain layer 700 is further provided with a plurality of fifth conductive connection parts 77, and each fifth conductive connection part 77 is disposed in the first source-drain layer 700 and distributed in each sub-pixel region. As shown in the figure, in each sub-pixel region, the projection of the fifth conductive connection part 77 on the base substrate overlaps with the projection of the drain 8d of the eighth driving transistor T8, and they are connected through the via hole penetrating the first gate insulating layer 200, the second gate insulating layer 400 and the first dielectric layer 600, and the projection of the fifth conductive connection part 77 on the base substrate also overlaps with the projection of the sixth conductive connection part 78 provided on the second source-drain layer 900, and they are connected to the sixth conductive connection part 78 through the via hole penetrating the second dielectric layer 800. The projection of the sixth conductive connection part 78 on the base substrate also overlaps with the projection of the anode of the sub-pixel, and they are connected through the via hole provided on the passivation layer 1000. That is to say, the drain 8d of the eighth transistor T8 is connected to the anode through the fifth conductive connection part 77 and the sixth conductive connection part 78 in sequence, so that the anode of the pixel can be driven. In each sub-pixel region, the fifth conductive connection part 77 is located at the right side of the connection line 10 and the first conductive connection part 75.

It should be noted that the circular structure at the lower left corner of the first source-drain layer 700 in the sub-pixel region in FIG. 11 is the right half of the fourth conductive connection part 76 of the adjacent sub-pixel on the left, and the right half of the four conductive connection part 76 in the sub-pixel region is located at the lower left corner of the adjacent sub-pixel on the right. In FIG. 12, the vertical wiring on the left of the second source-drain layer 900 in the sub-pixel region is the data line 71 of the adjacent sub-pixel on the left, and the data line 71 in the sub-pixel region can also be regarded as within the adjacent sub-pixel on the right.

Figure 14:
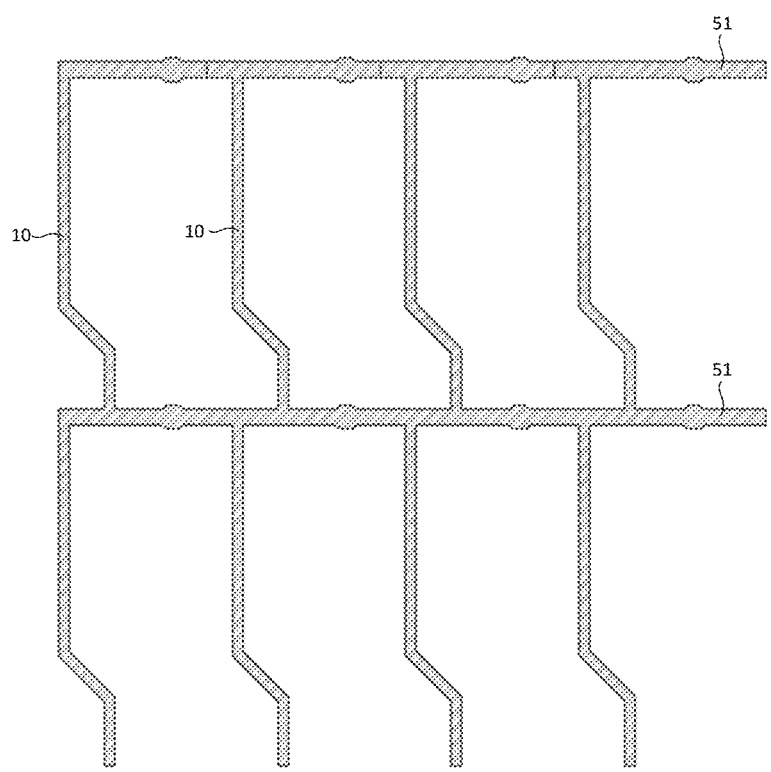
FIG. 14 is a schematic diagram of an array structure of a plurality of sub-pixels in the first embodiment.

FIG. 14 shows a schematic structural diagram of the array arrangement of eight sub-pixels, in which only the initialization signal lines 51 and the connection lines 10 in the first source-drain layer 700 are shown, and other conductive connection parts are not shown. In this embodiment, the number of connection lines 10 is the same as the number of sub-pixels in the row direction, that is, each column of sub-pixels s provided with one vertical connection line 10.

In this embodiment, since the first source-drain layer 700 is dry-etched, the initialization signal lines 51 and the connection lines 10 are disposed in the first source-drain layer 700, which can improve the etching yield. Moreover, the material resistance of the first source-drain layer 700 is low, which is beneficial to improving the IR drop.

Figure 15:
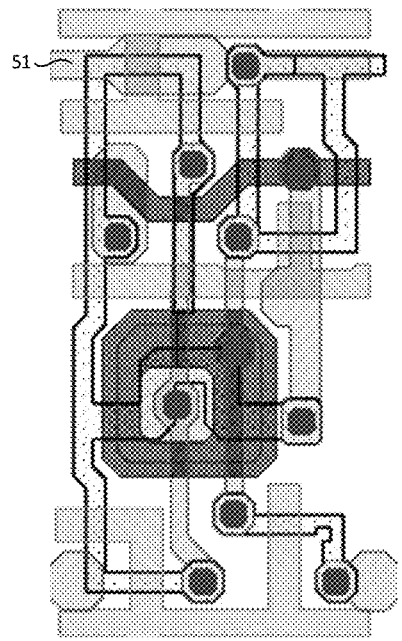
FIG. 15 is a schematic diagram of film stacking of an active layer, a first gate line layer, a second gate line layer, and a first source-drain layer in the second embodiment.
Figure 16:
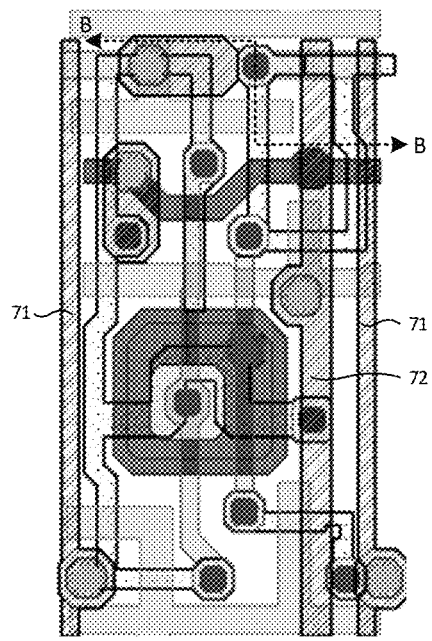
FIG. 16 is a schematic diagram of film stacking of an active layer, a first gate line layer, a second gate line layer, a first source-drain layer, and a second source-drain layer in the second embodiment.
Figure 17:
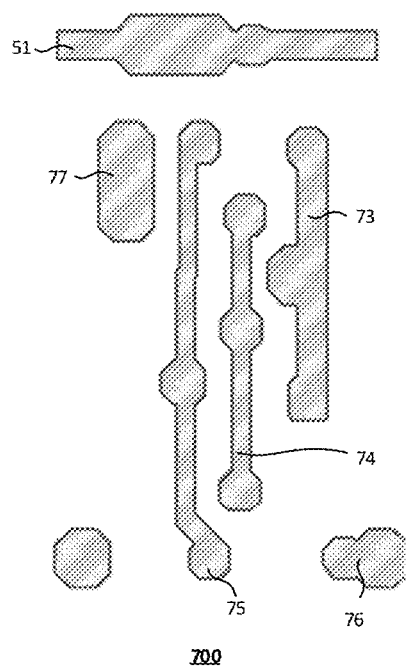
FIG. 17 is a schematic structural diagram of the first source-drain layer in the second embodiment.
Figure 18:
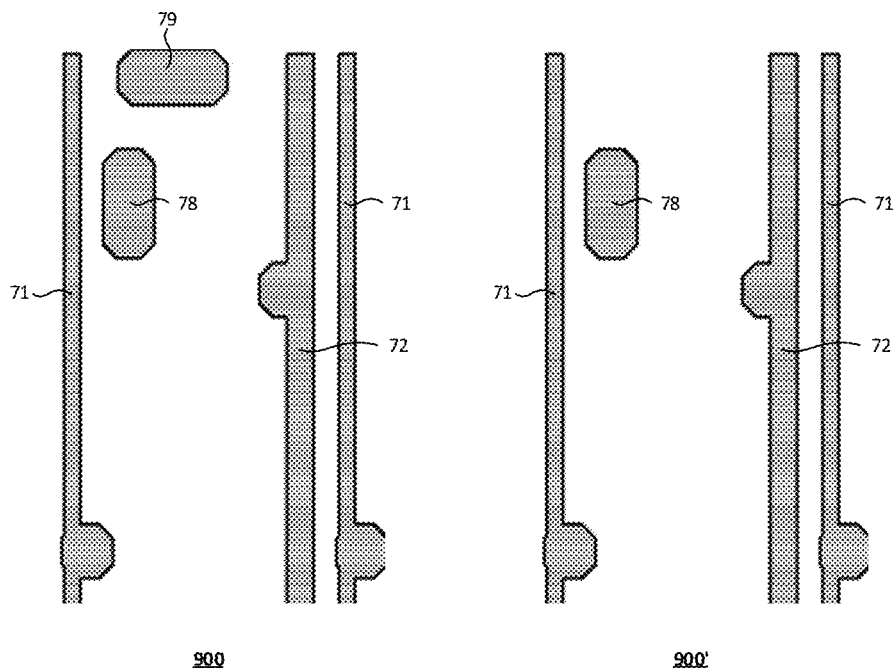
FIG. 18 is a schematic structural diagram of a second source-drain layer in the second embodiment.
Figure 19:
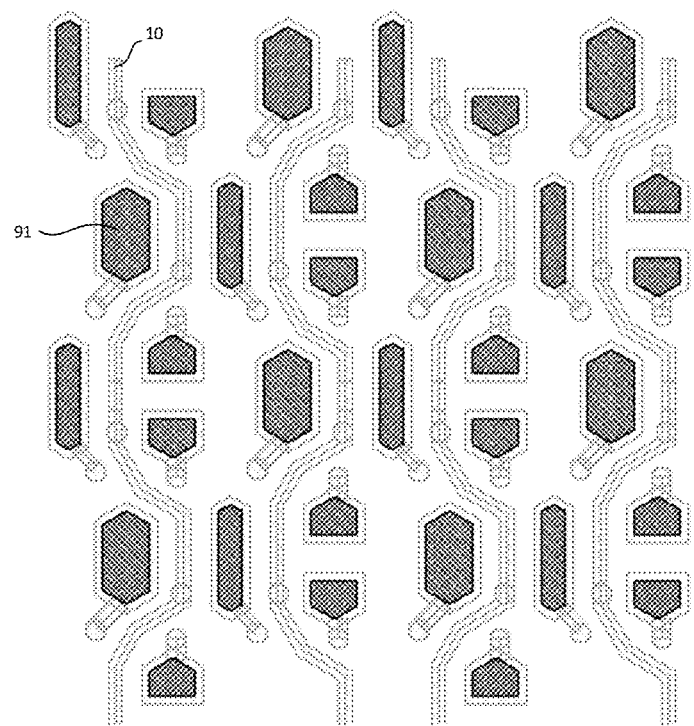
FIG. 19 is a schematic structural diagram of the anode layer in the second embodiment.
Figure 20:
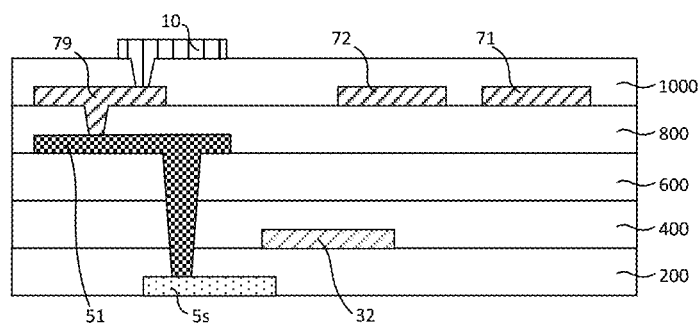
FIG. 20 is a sectional view taken along the direction B-B in FIG. 16.

FIGS. 15-16 show schematic diagrams of film stacking of the first source-drain layer 700 and the second source-drain layer 900 in a sub-pixel region in the second embodiment, and FIGS. 17-19 show schematic diagrams of the structure of each layer of the first source-drain layer 700, the second source-drain layer 900 and the anode layer 1100 in the sub-pixel region. The active layer 100, the first gate line layer 300 and the second gate line layer 500 are the same as those in FIG. 4, FIG. 9, and FIG. 10, so the related drawings and descriptions are omitted herein. FIG. 20 shows a schematic cross-sectional view along the line B-B in FIG. 16.

Referring to FIGS. 15 and 17, the first conductive layer is the first source-drain layer 700, that is, the initialization signal lines 51 are provided in the first source-drain layer 700, extend in the row direction and are arranged at intervals in the column direction. In this embodiment, the initialization signal lines 51 are located above the sub-pixel region, and the projection on the base substrate overlaps with the reset signal lines 32. Since the reset signal lines 32 are located in the first gate line layer 300, the initialization signal lines 51 are located in the first source-drain layer 700, there are many film layers between the reset signal lines 32 and the initialization signal lines 51, so parasitic capacitance is not easily generated even if there is overlap, which can ensure the stability of the signal. The first source-drain layer 700 is also provided with first to fifth conductive connection parts the same as those in FIG. 11, and the structures and functions thereof are the same as those in FIG. 11, which will not be repeated herein.

Referring to FIG. 19, the anode layer 1100 is used for disposing the anode 91 of the OLED light-emitting device, and is located in the opening of the pixel defining layer. An organic light-emitting layer and a cathode layer are also arranged in the opening. The film layer structure of the OLED light-emitting device may adopt a conventional structure, which will not be repeated herein. The figure shows a schematic structural diagram of the anode layer 1100 of the RGBG pixel structure.

In this embodiment, the second conductive layer is the anode layer 1100, that is, the connection line 10 is provided in the anode layer 1100, passes through the gap between the two anodes 91 in the longitudinal direction, and is insulated from any anode 91. The connection lines 10 are covered by the pixel definition layer, to avoid contacting with other film layers arranged above.

In order to realize the connection between the initialization signal line 51 and the connection line 10, referring to FIGS. 15, 17 and 20, a seventh conductive connection part 79 is provided on the second source-drain layer 900, and a plurality of seventh conductive connection parts 79 are distributed in a sub-pixel region where the projections of the initialization signal line 51 and the connection line 10 intersect, in other words, not necessarily the second source-drain layers 900 of all the sub-pixels are provided with the seventh conductive connection part 79, but the seventh conductive connection part is distributed in the sub-pixel where the initialization signal line 51 and the connection line 10 are connected. In FIG. 17, 900 represents the first source-drain layer structure provided with the seventh conductive connection part 79, and 900' represents the first source-drain layer structure without providing with the seventh conductive connection part 79. In the sub-pixel region provided with the seventh conductive connection part 79, the projection of the seventh conductive connection part 79 on the base substrate and the projection of the initialization signal line 51 have an overlapping area, and the seventh conductive connection part 79 and the initialization signal line 51 are connected through the via hole provided on the second dielectric layer 800, the projection of the seventh conductive connection part 79 on the base substrate and the projection of the connection line 10 have an overlapping area, and the seventh conductive connection part 79 and the connection line 10 are connected through the via hole provided on the passivation layer 1000, so that the initialization signal line 51 and the connection line 10 are electrically connected through the seventh conductive connection part 79.

The second source-drain layer 900 is also provided with the power supply lines 72, data lines 71 and the sixth conductive connection part 78 the same as those in FIG. 12, whose structures and functions are the same as in FIG. 12, and will not be repeated herein.

Figure 21:
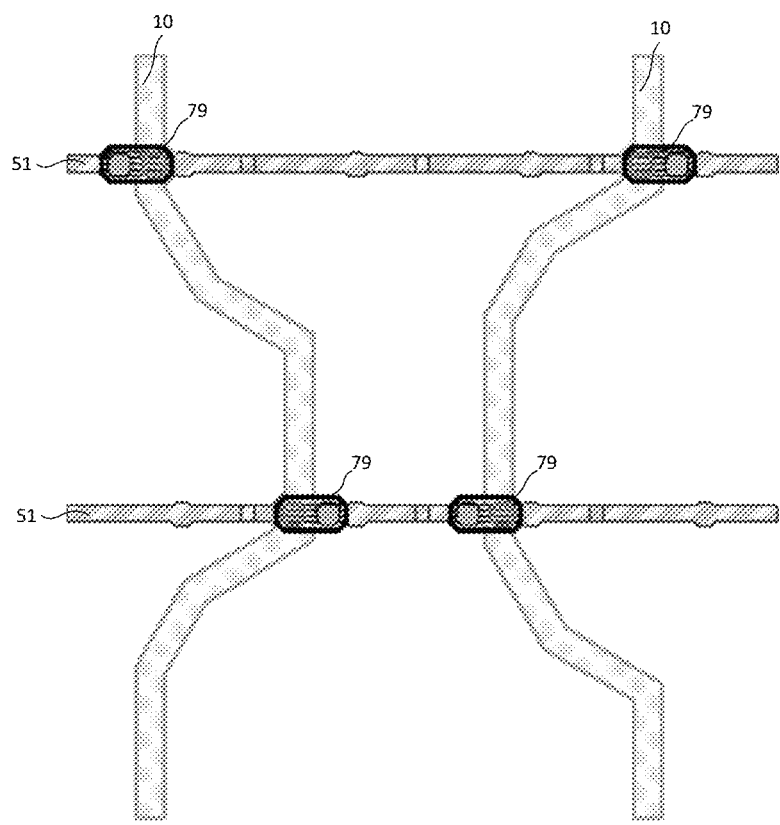
FIG. 21 is a schematic diagram of an array structure of a plurality of sub-pixels in the second embodiment.

FIG. 21 shows a schematic structural diagram of the array arrangement of eight sub-pixels shown in FIG. 16, in which only the initialization signal lines 51 in the first source-drain layer 700, the seventh conductive connection part 79 in the second source-drain layer 900, and the connection lines 10 of the anode layer 1100 are shown, other circuit structures are not shown. As can be seen from the figure, in this embodiment, the number of connection lines 10 is half of the number of sub-pixels in the row direction, that is, one of every two adjacent sub-pixels in the row direction is provided with a connection line 10, while the other is not provided with a connection line 10. In addition, in this embodiment, each connection line 10 is not arranged to pass through the same column of sub-pixels, but is arranged in a bend in two adjacent columns of sub-pixels. Specifically, in the sub-pixels in the previous row, the connection line 10 is correspondingly connected to the initialization signal line 51 in the left sub-pixel, and in the sub-pixel in the next row, the connection line 10 is bent to be correspondingly connected to the initialization signal line 51 in the right sub-pixel, which is to avoid the pixels on the anode layer 1100. It should be noted that, although the connection line 10 is bent in the longitudinal direction, it is still regarded as extending in the longitudinal direction since its overall direction is in the longitudinal direction.

Figure 22:
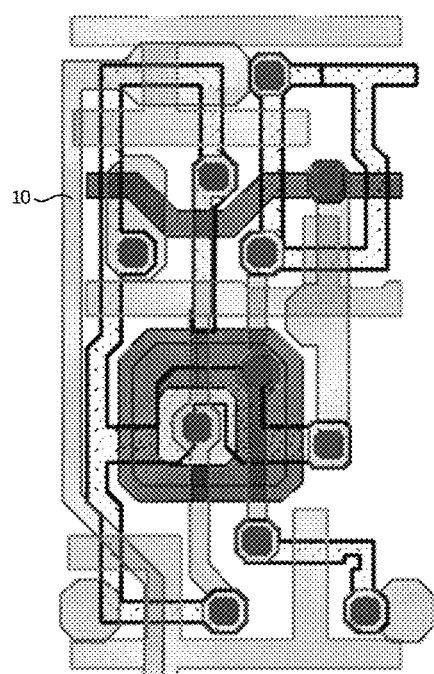
FIG. 22 is a schematic view of the film stacking of the active layer, the first gate line layer, the second gate line layer, and the first source-drain layer in the third embodiment.
Figure 23:
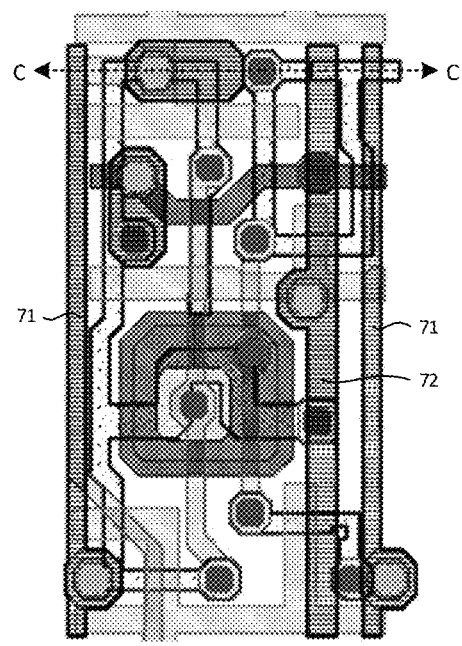
FIG. 23 is a schematic view of the film stacking of the active layer, the first gate line layer, the second gate line layer, the first source-drain layer, and the second source-drain layer in the third embodiment.
Figure 24:
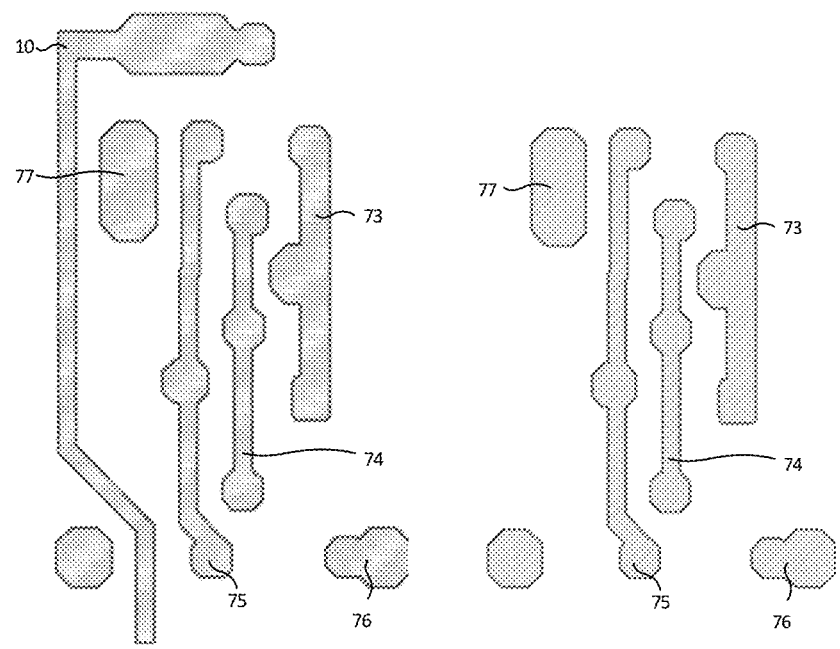
FIG. 24 is a schematic structural diagram of the first source-drain layer in the third embodiment.
Figure 25:
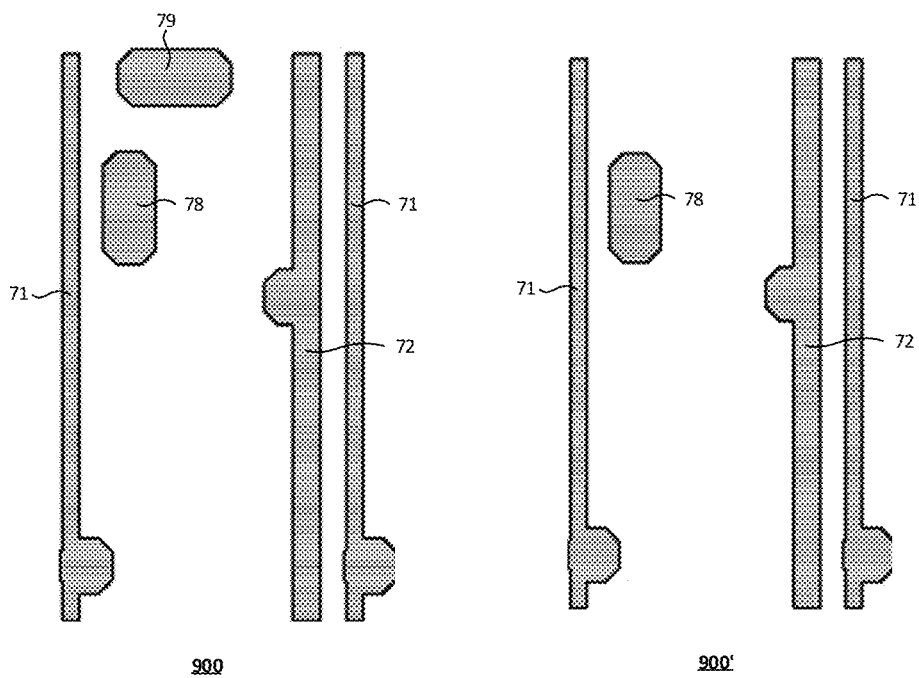
FIG. 25 is a schematic structural diagram of the second source-drain layer in the third embodiment.
Figure 26:
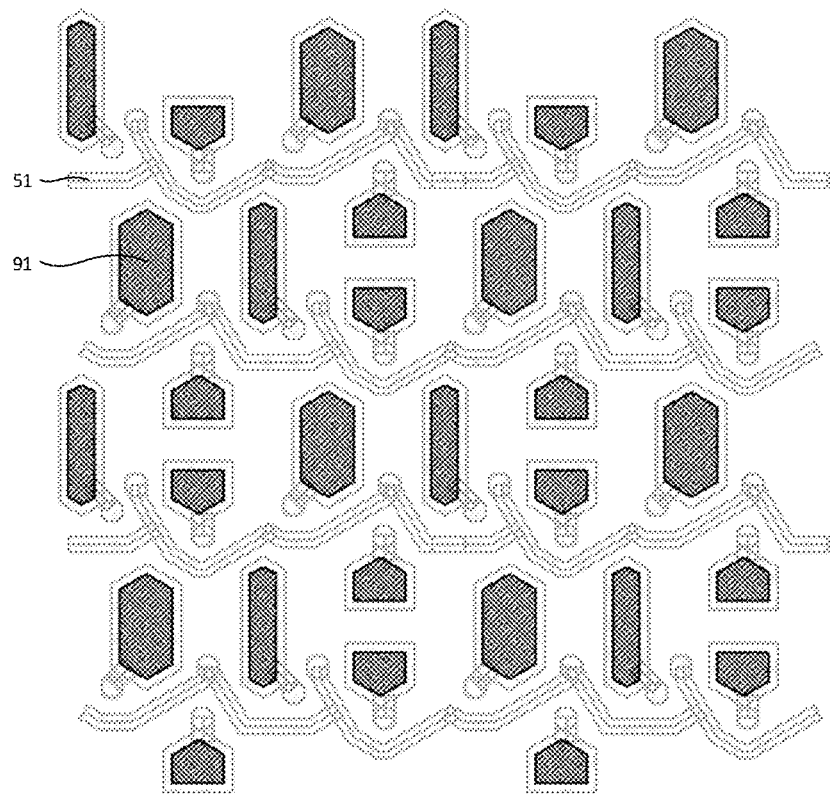
FIG. 26 is a schematic structural diagram of the anode layer in the third embodiment.
Figure 27:
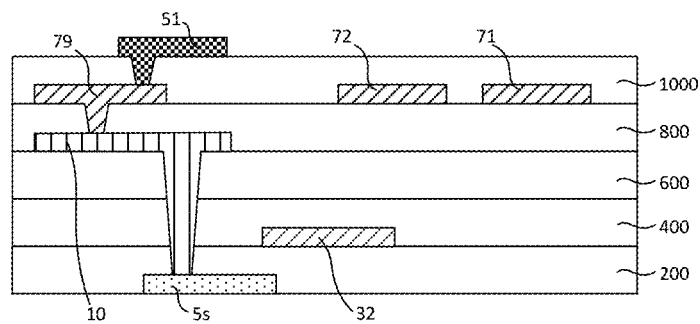
FIG. 27 is a schematic cross-sectional view taken along the direction C-C in FIG. 23.

FIGS. 22-23 show schematic diagrams of film stacking of the first source-drain layer 700 and the second source-drain layer 900 in a sub-pixel region in the third embodiment, and FIGS. 24-26 show schematic diagrams of the structure of each layer of the first source-drain layer 700, the second source-drain layer 900 and the anode layer 1100 in one sub-pixel region. The active layer 100, the first gate line layer 300 and the second gate line layer 500 are the same as those in FIG. 4, FIG. 9, and FIG. 10, so the related drawings and descriptions are omitted herein. FIG. 27 shows a schematic cross-sectional view along the line C-C in FIG. 23.

Referring to FIGS. 22 and 24, in the present embodiment, the second conductive layer is the first source-drain layer 700, that is, the connection lines 10 are provided in the first source-drain layer 700, extend in the column direction and are arranged at intervals in the row direction. The connection line 10 is located on the left side of the sub-pixel region. Referring to FIG. 26, in this embodiment, the number of connection lines is half of the number of sub-pixels in the row direction, that is, one of every two adjacent sub-pixels in the row direction is provided with a connection line 10, while the other is not provided with a connection line 10. Therefore, 700 in FIG. 24 represents a schematic structural diagram of the first source-drain layer provided with the connection line 10, and 700' represents a schematic structural diagram of the first source-drain layer without providing with the connection line 10. The first source-drain layer 700 is also provided with the first to fifth conductive connection parts the same as those in FIG. 11, all of which are located on the right side of the connection line 10, and their structures and functions are the same as those described above, and will not be repeated herein.

Referring to the schematic structural diagram of the anode layer 1100 of the RGBG pixel structure shown in FIG. 26, in this embodiment, the first conductive layer is the anode layer 1100, that is, the initialization signal line 51 is provided in the anode layer 1100 and passes through the gap between two rows of sub-layers in the horizontal direction, and is insulated from any anode 91. The initialization signal line 51 is covered by the pixel definition layer, to avoid contacting with other film layers arranged above. In order to avoid the pixel opening area, the initialization signal line 51 is bent, but its overall extending direction is still horizontal.

In order to realize the connection between the initialization signal line 51 and the connection line 10, referring to FIGS. 23, 25 and 27, a seventh conductive connection part 79 is provided on the second source-drain layer 900, and a plurality of seventh conductive connection parts 79 are distributed in a sub-pixel region where the projections of the initialization signal line 51 and the connection line 10 intersect, in other words, not necessarily the second source-drain layers 900 of all the sub-pixels are provided with the seventh conductive connection part 79, but the seventh conductive connection part is distributed in the sub-pixel where the initialization signal line 51 and the connection line 10 are connected. In FIG. 25, 900 represents the second source-drain layer structure provided with the seventh conductive connection part 79, and 900' represents the second source-drain layer structure without providing with the seventh conductive connection part 79. In the sub-pixel region provided with the seventh conductive connection part 79, the projection of the seventh conductive connection part 79 on the base substrate and the projection of the connection line 10 have an overlapping area, and the seventh conductive connection part 79 and the connection line 10 are connected through the via hole provided on the second dielectric layer 800. The projection of the seventh conductive connection part 79 on the base substrate and the projection of the initialization signal line 51 also have an overlapping area, and the seventh conductive connection part 79 and the initialization signal line 51 are connected through the via hole provided on the passivation layer 1000, so that the initialization signal line 51 and the connection line 10 are electrically connected through the seventh conductive connection part 79.

In addition, since the initialization signal line 51 also needs to be connected to the source 5s of the fifth transistor T5, in the sub-pixel region where the connection line 10 is provided, the projection of the connection line 10 on the base substrate also has an overlapping area with the projection of the source 5s of the fifth transistor T5. The connection line 10 is connected to the source 5s of the fifth transistor T5 through a via hole penetrating the first gate insulating layer 200, the second gate insulating layer 400 and the first dielectric layer 600. Since the initialization signal line 51 and the connection line 10 are electrically connected, the initialization signal line 51 is sequentially connected to the source 5s of the fifth transistor T5 through the seventh conductive connection part 79 and the connection line. In this embodiment, the wiring arrangement of other lines of the second source-drain layer 900 is also the same as that in the previous embodiment.

The second source-drain layer 900 is also provided with the power supply lines 72, data lines 71 and the sixth conductive connection part 78 the same as those in FIG. 12, whose structures and functions are the same as in FIG. 12, and will not be repeated herein.

Figure 28:
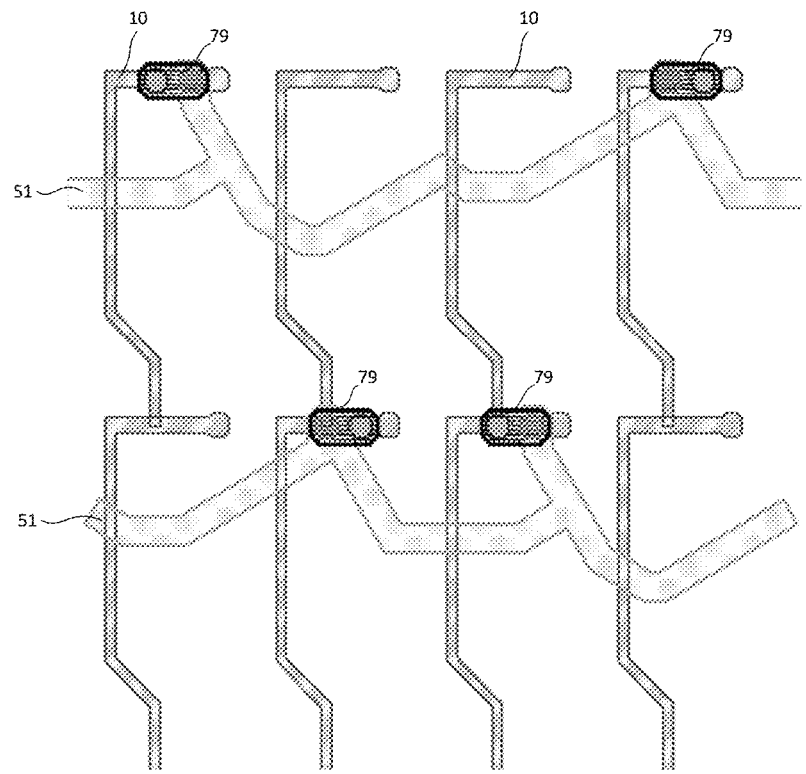
FIG. 28 is a schematic diagram of an array structure of a plurality of sub-pixels in the third embodiment.

FIG. 28 shows a schematic structural diagram of the array arrangement of eight sub-pixels, in which only the connection lines 10 in the first source-drain layer 700, the seventh conductive connection part 79 in the second source-drain layer 700, and the initialization signal lines 51 in the anode layer 1100 are shown, other circuit structures are not shown. In this embodiment, the number of connection lines 10 is the same as the number of sub-pixels in the row direction, that is, each column of sub-pixels is provided with one vertical connection line 10 and one seventh conductive connection part 79.

The above embodiments provide various setting positions and connection manners of the initialization signal lines and connection lines of the present disclosure, and various structures of the present disclosure can take into account the PPI requirements and performance requirements of different products while making reasonable wiring. It can be understood that the setting positions and connection manners of the initialization signal lines and the connection lines can be combined arbitrarily, so as to meet the requirements of the PPI of the display panel, process practicability and display performance. In addition, the above embodiments are described with the pixel circuit structure of 9T1C as an example. When the array substrate adopts other pixel circuit structures, the initialization signal lines and connection lines can also be set in the form of the dual source-drain layer of the present disclosure, so that they can form a grid shape, which can also reduce IR drop and relieve wiring pressure. In addition, each of the above pixel units is composed of four sub-pixels of RGBG, and only one algorithm of arrangement is used as an example for the description. The structure of the layered connection of the initialization signal lines and the connection lines of the present disclosure in a grid shape can also be applied to the RGBG pixel structures arranged in other algorithms. Further, when the pixel unit adopts other setting manners, such as RGB, RGBW, etc., the initialization signal lines and the connection lines can also be connected in a grid shape through the dual source-drain layer, which can also reduce the IR drop and relieve the wiring pressure.

Embodiments of the present disclosure further provide a display device including the array substrate of the above-mentioned embodiments. Since the display device includes the above-mentioned array substrate, it has the same beneficial effects, and details are not described here in the present disclosure.

The present disclosure does not specifically limit the application of display devices, which can be any product or component with the flexible display function, such as TVs, notebook computers, tablet computers, wearable display devices, mobile phones, in-vehicle displays, navigation, e-books, digital photo frames, advertising light boxes, etc.

Those skilled in the art will easily think of other embodiments of the present disclosure after considering the specification and practicing the disclosure disclosed herein. This disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are indicated by the appended claims.

What is claimed is:

1. An array substrate, comprising:
    a plurality of pixel units arranged in an array, the pixel units comprising a plurality of sub-pixels;
    a plurality of initialization signal lines arranged in a first conductive layer on the array substrate, extending along a first direction and arranged at intervals along a second direction, and configured to provide initialization signals to each of the sub-pixels, wherein the first direction and the second direction intersect;
    a plurality of connection lines arranged in a second conductive layer on the array substrate, and extending along the second direction and arranged at intervals along the first direction, wherein:
    the first conductive layer and the second conductive layer are an identical layer or different layers; and
    projections of at least one of the initialization signal lines and at least one of the connection lines on the array substrate intersect and are electrically connected, such that the projections of the initialization signal lines and the connection lines on the array substrate form a grid structure,
    wherein the array substrate comprises a base substrate and a first source-drain layer, a second source-drain layer, and an anode layer sequentially stacked on the base substrate.

2. The array substrate according to claim 1, wherein:
    in the first conductive layer and the second conductive layer, at least any one thereof is the first source-drain layer, and the other one thereof is the first source-drain layer or the anode layer;
    the first direction is a row direction, and the second direction is a column direction; and
    the array substrate further comprises:

data lines arranged on the second source-drain layer, extending along the column direction and arranged at intervals along the row direction, and configured to provide data signals to each of the sub-pixels; and power supply lines arranged on the second source-drain layer, extending along the column direction and arranged at intervals along the row direction, and configured to provide power supply signals to each of the sub-pixels.

3. The array substrate according to claim 2, wherein the first conductive layer and the second conductive layer are both the first source-drain layers, the initialization signal lines extend along the row direction, and the connection lines extend along the column direction, each of the initialization signal lines is connected to each of the connection lines and intersected in a grid shape.

4. The array substrate according to claim 3, wherein:
the array substrate further comprises a first gate line layer and a second gate line layer disposed on the base substrate;
the sub-pixel further comprises a sub-pixel driving circuit, the sub-pixel driving circuit comprising a capacitor and a driving transistor, the capacitor comprising a first plate and a second plate, the first plate being arranged in the first gate line layer, the second plate being arranged in the second gate line layer, the first plate of the capacitor being multiplexed as a gate of the driving transistor, and a first electrode of the driving transistor being connected to the power supply line;
the first source-drain layer is further provided with a plurality of third conductive connection parts, and the third conductive connection parts are distributed in each sub-pixel region; and
the third conductive connection part is connected to the first electrode of the driving transistor through a via hole, and the third conductive connection part is further connected to the power supply line through a via hole, such that the power supply line is electrically connected to the first electrode of the driving transistor through the third conductive connection part.

5. The array substrate according to claim 4, wherein:
the array substrate further comprises a plurality of scan lines, the scan lines are provided in the first gate line layer, extend along the row direction and are arranged at intervals along the column direction, and are configured to provide scanning signals to each of the sub-pixels;
the sub-pixel driving circuit further comprises a first transistor, a gate of the first transistor is connected to the scan line, a first electrode of the first transistor is connected to the data line, and a second electrode of the first transistor is connected to the second plate of the capacitor;
the first source-drain layer is further provided with a plurality of fourth conductive connection parts, and the fourth conductive connection parts are distributed in each sub-pixel region; and
the fourth conductive connection part is connected to the first electrode of the first transistor through a via hole, and the fourth conductive connection part is further connected to the data line through a via hole, such that the data line is electrically connected to the first electrode of the first transistor through the fourth conductive connection part.

6. The array substrate according to claim 5, wherein:
the sub-pixel comprises an anode disposed in the anode layer; the array substrate further comprises a plurality of reset signal lines, the reset signal lines are disposed in the first gate line layer, extend along the row direction and are arranged at intervals along the column direction, and are configured to provide reset signals to each of the sub-pixels;
the sub-pixel driving circuit further comprises an eighth transistor, a gate of the eighth transistor is connected to the reset signal line, a first electrode of the eighth transistor is electrically connected to the initialization signal line, and a second electrode of the eighth transistor is electrically connected to the anode of the sub-pixel;
the first source-drain layer is further provided with a plurality of fifth conductive connection parts, the second source-drain layer is further provided with a plurality of sixth conductive connection parts, and the fifth conductive connection parts and the sixth conductive connection parts are distributed in each sub-pixel region; and
the fifth conductive connection part and the second electrode of the eighth transistor are connected through a via hole, the fifth conductive connection part and the sixth conductive connection part are connected through a via hole, and the sixth conductive connection part and the anode are connected through a via hole, such that the second electrode of the eighth transistor is electrically connected to the anode of the sub-pixel.

7. The array substrate according to claim 6, wherein:
the array substrate further comprises a plurality of light-emitting control signal lines, the light-emitting control signal lines are disposed in the first gate line layer, extend along the row direction and are arranged at intervals along the column direction, and are configured to provide light-emitting control signals to each of the sub-pixels;
the sub-pixel driving circuit further comprises a second transistor and a ninth transistor, a gate of the second transistor is connected to the scan line, and a first electrode of the second transistor is connected to a second electrode of the driving transistor, a second electrode of the second transistor is connected to the first plate of the capacitor; a gate of the ninth transistor is connected to the light-emitting control signal line, and a first electrode of the ninth transistor is electrically connected to the first plate of the capacitor;
the first source-drain layer is further provided with a plurality of first conductive connection parts, and the first conductive connection parts are distributed in each sub-pixel region; and
the first conductive connection part is connected to the second electrode of the second transistor and the first electrode of the ninth transistor through a via hole, and the first conductive connection part is further connected to the first plate of the capacitor through a via hole, such that the second electrode of the second transistor and the first electrode of the ninth transistor are electrically connected to the first plate of the capacitor.

8. The array substrate according to claim 7, wherein:
the sub-pixel driving circuit further comprises a fifth transistor and a sixth transistor, a gate of the fifth transistor is connected to the reset signal line, and a first electrode of the fifth transistor is electrically connected to the initialization signal line, a second electrode of the fifth transistor is electrically connected to the second plate of the capacitor; a gate of the sixth transistor is connected to the light-emitting control signal line, a first electrode of the sixth transistor is electrically connected to the initialization signal line, and a second electrode of the sixth transistor is electrically connected to the second plate of the capacitor;

the first source-drain layer is further provided with a plurality of second conductive connection parts, and the second conductive connection parts are distributed in each sub-pixel region; and the second conductive connection part is connected to the second electrode of the first transistor, the second electrode of the fifth transistor, and the second electrode of the sixth transistor through a via hole, and the second conductive connection part is further connected to the second plate of the capacitor through a via hole, such that the second electrode of the first transistor, the second electrode of the fifth transistor, the second electrode of the sixth transistor are electrically connected to the second plate of the capacitor.

9. The array substrate according to claim 8, wherein the sub-pixel driving circuit further comprises:

a fourth transistor, wherein a gate of the fourth transistor is connected to the reset signal line, a first electrode of the fourth transistor is electrically connected to the initialization signal line, and a second electrode of the fourth transistor is electrically connected to the first plate of the capacitor; and a seventh transistor, wherein a gate of the seventh transistor is connected to the light-emitting control signal line, a first electrode of the seventh transistor is electrically connected to the second electrode of the driving transistor, a second electrode of the seventh transistor is electrically connected to the anode of the sub-pixel.

10. The array substrate according to claim 4, wherein the array substrate further comprises:

a plurality of power supply leads, arranged in the second gate line layer, extending along the row direction and arranged at intervals along the column direction, wherein the power supply lines located in each sub-pixel region in an identical row are connected to one power supply lead through a via hole;

wherein, the third conductive connection part is further connected to the power supply line through a via hole, such that the power supply line and the power supply lead are electrically connected.

11. The array substrate according to claim 2, wherein the first conductive layer is the first source-drain layer, the second conductive layer is the anode layer; the initialization signal lines are arranged in the first source-drain layer, extend along the row direction and are arranged at intervals along the column direction; the connection lines are arranged in the anode layer, extend along the column direction and are arranged at intervals along the row direction; each of the initialization signal lines and each of the connection lines are electrically connected through a via hole, and the projections of the plurality of initialization signal lines and the plurality of connection lines on the base substrate intersect in a grid shape.

12. The array substrate according to claim 11, wherein the second source-drain layer is further provided with a plurality of seventh conductive connection parts, and the seventh conductive connection parts are distributed in a sub-pixel region where the projections of the initialization signal line and the connection line intersect; and wherein, the seventh conductive connection part is connected to the initialization signal line through a via hole, and the seventh conductive connection part is connected to the connection line through another via hole, such that the initialization signal line and the connection line are electrically connected through the seventh conductive connection part.

13. The array substrate according to claim 2, wherein the first conductive layer is an anode layer, the second conductive layer is a first source-drain layer; the initialization signal lines are arranged in the anode layer, extend along the row direction and are arranged at intervals along the column direction; the connection lines are arranged in the first source-drain layer, extend along the column direction and are arranged at intervals along the row direction; each of the initialization signal lines and each of the connection lines are electrically connected through a via hole, and the projections of the plurality of initialization signal lines and the plurality of connection lines on the base substrate intersect in a grid shape.

14. The array substrate according to claim 1, wherein:

a number of the connection lines is equal to a number of sub-pixels in the row direction and, in the row direction, the initialization signal lines and the connection lines are electrically connected through via holes in each sub-pixel region; or a number of the connection lines is smaller than a number of sub-pixels in the row direction and, in the row direction, the initialization signal lines and the connection lines are electrically connected through via holes in a part of the sub-pixel regions.

15. A display device, comprising:

an array substrate, comprising:

a plurality of pixel units arranged in an array, the pixel units comprising a plurality of sub-pixels;

a plurality of initialization signal lines arranged in a first conductive layer on the array substrate, extending along a first direction, and arranged at intervals along a second direction, and configured to provide initialization signals to each of the sub-pixels, wherein the first direction and the second direction intersect;

a plurality of connection lines arranged in a second conductive layer on the array substrate, extending along the second direction, and arranged at intervals along the first direction, wherein:

the first conductive layer and the second conductive layer are an identical layer or different layers; and projections of at least one of the initialization signal lines and at least one of the connection lines on the array substrate are intersected and electrically connected, such that the projections of the initialization signal lines and the connection lines on the array substrate form a grid structure, wherein the array substrate comprises a base substrate and a first source-drain layer, a second source-drain layer, and an anode layer sequentially stacked on the base substrate.

16. The display device according to claim 15, wherein:

in the first conductive layer and the second conductive layer, at least any one thereof is the first source-drain layer, and the other one thereof is the first source-drain layer or the anode layer, the first direction being a row direction, and the second direction being a column direction; and the array substrate further comprises:

data lines arranged on the second source-drain layer, extending along the column direction, and arranged at intervals along the row direction, and configured to provide data signals to each of the sub-pixels; and power supply lines arranged on the second source-drain layer, extending along the column direction, and arranged at intervals along the row direction, and configured to provide power supply signals to each of the sub-pixels.

17. The display device according to claim 16, wherein the first conductive layer and the second conductive layer are both the first source-drain layers, the initialization signal lines extend along the row direction, and the connection lines extend along the column direction, each of the initialization signal lines is connected to each of the connection lines and intersected in a grid shape.

18. The display device according to claim 16, wherein the first conductive layer is the first source-drain layer, the second conductive layer is the anode layer; the initialization signal lines are arranged in the first source-drain layer, extend along the row direction and are arranged at intervals along the column direction; the connection lines are arranged in the anode layer, extend along the column direction and are arranged at intervals along the row direction; each of the initialization signal lines and each of the connection lines are electrically connected through a via hole, and the projections of the plurality of initialization signal lines and the plurality of connection lines on the base substrate intersect in a grid shape.

19. The display device according to claim 18, wherein:
the second source-drain layer is further provided with a plurality of seventh conductive connection parts, and the seventh conductive connection parts are distributed in a sub-pixel region where the projections of the initialization signal line and the connection line intersect; and the seventh conductive connection part is connected to the initialization signal line through a via hole, and the seventh conductive connection part is connected to the connection line through another via hole, such that the initialization signal line and the connection line are electrically connected through the seventh conductive connection part.

20. The display device according to claim 16, wherein the first conductive layer is the anode layer, the second conductive layer is the first source-drain layer; the initialization signal lines are arranged in the anode layer, extend along the row direction and are arranged at intervals along the column direction; the connection lines are arranged in the first source-drain layer, extend along the column direction and are arranged at intervals along the row direction; each of the initialization signal lines and each of the connection lines are electrically connected through a via hole, and the projections of the plurality of initialization signal lines and the plurality of connection lines on the base substrate intersect in a grid shape.

* * * * *